(12) United States Patent
Barna et al.

(10) Patent No.: US 6,295,013 B1
(45) Date of Patent: Sep. 25, 2001

(54) NONLINEAR FLASH ANALOG TO DIGITAL CONVERTER USED IN AN ACTIVE PIXEL SYSTEM

(75) Inventors: Sandor Barna, Pasadena; Daniel Van Blerkam, Valencia; Eric R. Fossum, La Crescenta, all of CA (US)

(73) Assignee: Photobit Corporation, Pasadena, CA (US)

( * ) Notice: Subject to any disclaimer, the term of this patent is extended or adjusted under 35 U.S.C. 154(b) by 0 days.

(21) Appl. No.: 09/161,355

(22) Filed: Sep. 25, 1998

(51) Int. Cl.[7] .............................. H03M 1/62; H03M 1/78
(52) U.S. Cl. ............................... 341/138; 341/154
(58) Field of Search ....................... 341/138, 158, 341/154, 156, 159, 118, 141, 160; 348/230, 272, 294; 338/203

(56) References Cited

U.S. PATENT DOCUMENTS 5,059,980 * 10/1991 Katzenstein ................. 341/159

FOREIGN PATENT DOCUMENTS 6-276538 * 9/1994 (JP) .

OTHER PUBLICATIONS

Carbone et al, "Stochastic–Flash Analog–to–Digital Conversion," IEEE, 1998.*

Kawahito et al, "A Compressed Digital Output CMOS Image Sensor . . . ," IEEE, 1997.*

Tanner et al, "An 8–bit Low–Power ADC Array for CMOS Image Sensors,"IEEE, 1998.*

* cited by examiner

Primary Examiner—Patrick Wamsley
(74) Attorney, Agent, or Firm—Fish & Richardson P.C.

(57) ABSTRACT

A non-uniform resistor is used with a flash A to D converter in order to provide an A to D output which is not linear. The nonlinearity of the A to D output is specially designed to carry out a predetermined correction of the signal.

14 Claims, 6 Drawing Sheets

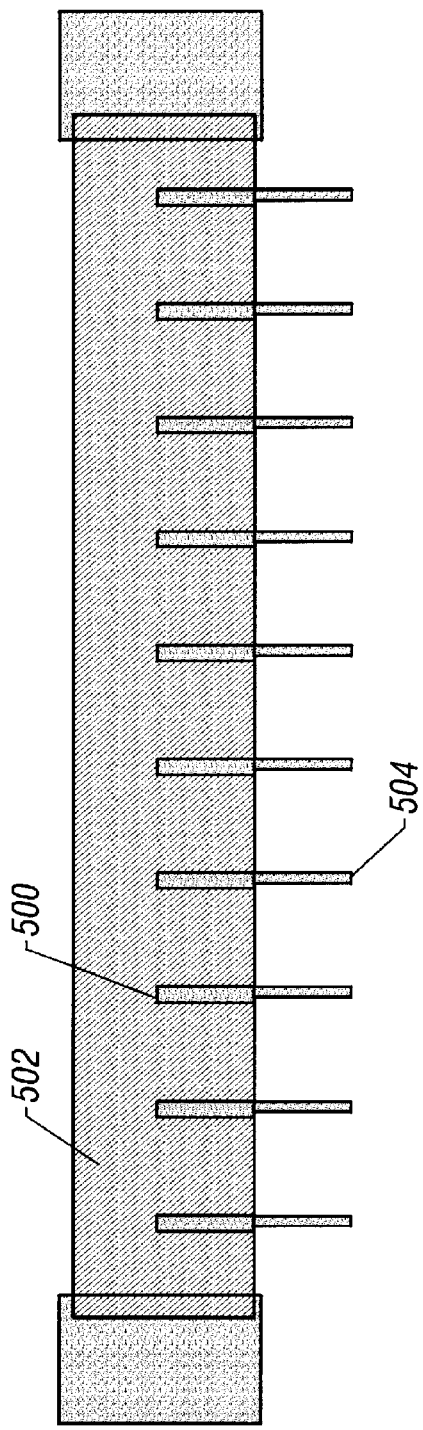
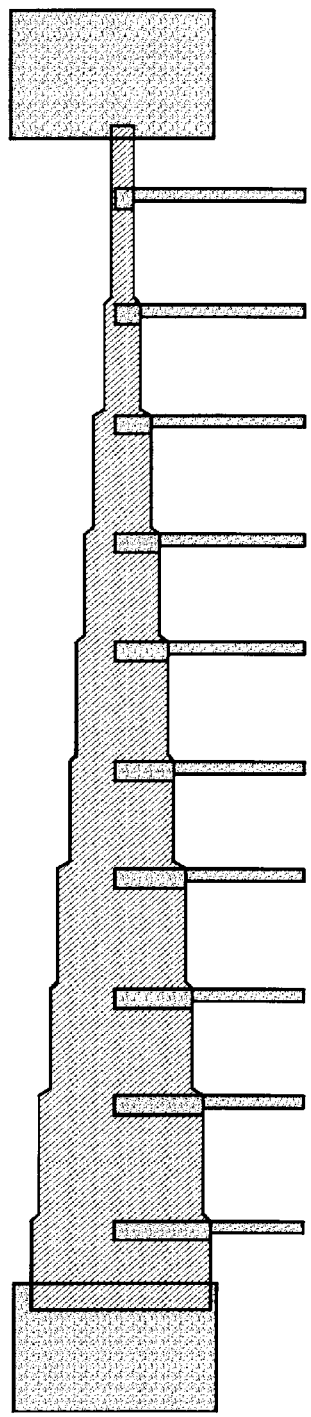
FIG. 5 (Prior Art)
FIG. 6

NONLINEAR FLASH ANALOG TO DIGITAL CONVERTER USED IN AN ACTIVE PIXEL SYSTEM

BACKGROUND

The present application relates to an active pixel sensor with an embedded A to D converter. More specifically, the present application describes using a flash A to D converter that has a nonlinear aspect.

FIG. 1 shows standard input/output curves of a video monitor. Curve 100 is an ideal I/O characteristic which would be completely linear between input and output. However, it is well known that most monitors have a more realistic characteristic shown as curve 102. The lower end of the brightness scale has less gain. The upper end of the scale blooms and cuts off.

These characteristics lead to a known complementary correction being applied to the output of image devices. This correction usually has two components: a gamma (γ) correction at the lower end and knee correction at the upper end. Curve 104 shows these conventional corrections. The gamma correction increases the contrast at the lower end of the signal range to compensate for reduced gain at the lower end of the monitor responsivity characteristic. The knee correction extends the dynamic range of the monitor at the upper end.

These corrections can be done in many different ways. One correction uses nonlinear CMOS diodes which operate as nonlinear resistors. However, these processes are difficult to fabricate reliably in a CMOS process. Another way is by using a digital signal processor.

The correction must be applied at video rates, thus necessitating fast signal processing for digital output sensors.

SUMMARY OF THE INVENTION

The present system defines using an A to D converter which has an embedded correction as part of its circuitry.

BRIEF DESCRIPTION OF THE DRAWINGS

These and other aspects will now be described in detail with reference to the accompanying drawings, wherein:

FIG. 5 shows a prior art diagram of a prior art resistor used in a flash converter;

FIG. 6 shows the nonuniform resistor used in a flash converter according to the present system;

DESCRIPTION OF THE PREFERRED EMBODIMENTS

Figure 1:
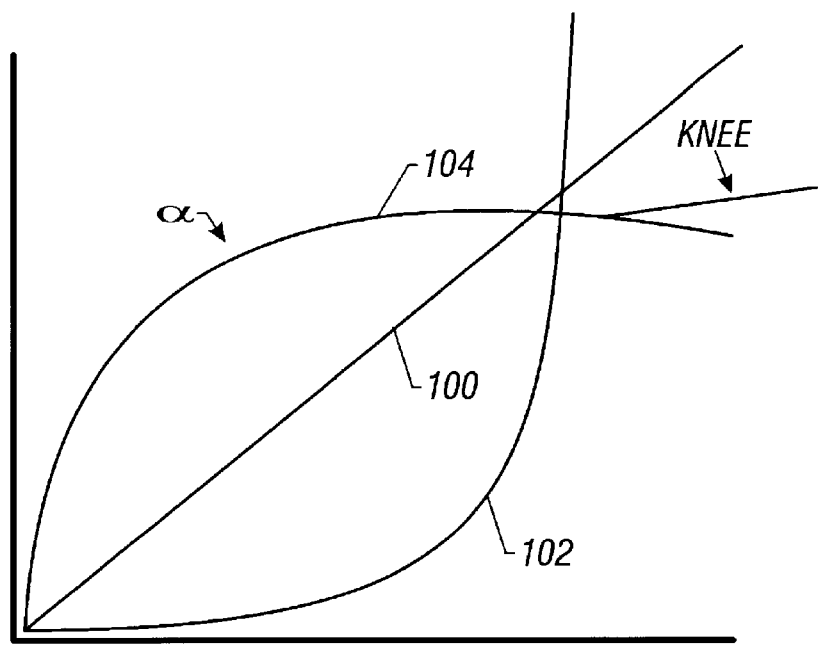
FIG. 1 shows a standard correction system for correcting gamma and knee correction in a video system.
Figure 2:
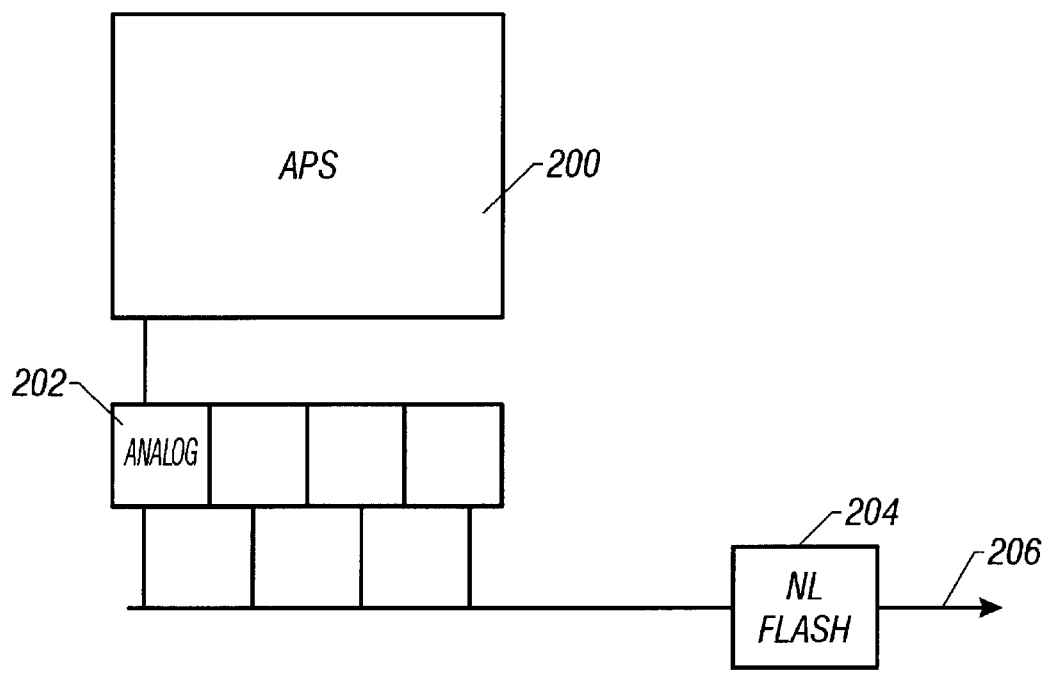
FIG. 2 shows the basic architecture block diagram of the preferred system.

An embodiment of the embedded system is shown in FIG. 2. Array 200 is an array of active pixel sensors of the type described in U.S. Pat. No. 5,471,515, the disclosure of which is herewith incorporated by reference to the extent necessary for proper understanding. A semiconductor substrate is formed with an image sensor, e.g., an array of photodiodes, photogates, pinned photodiodes, or, less preferably CCDs or charge injection devices (CIDs) any other image acquisition structure. Each column of the array of the active pixel sensor 200 is associated with an analog processing circuit 202, also formed on the same substrate. The analog processing circuit is shown in further detail in FIG. 3. The analog processor removes fixed pattern noise to produce an output that is amplified and fixed-pattern-noise-reduced. The output is A to D converted on the same substrate, by a flash A to D converter, as described herein.

Figure 3:
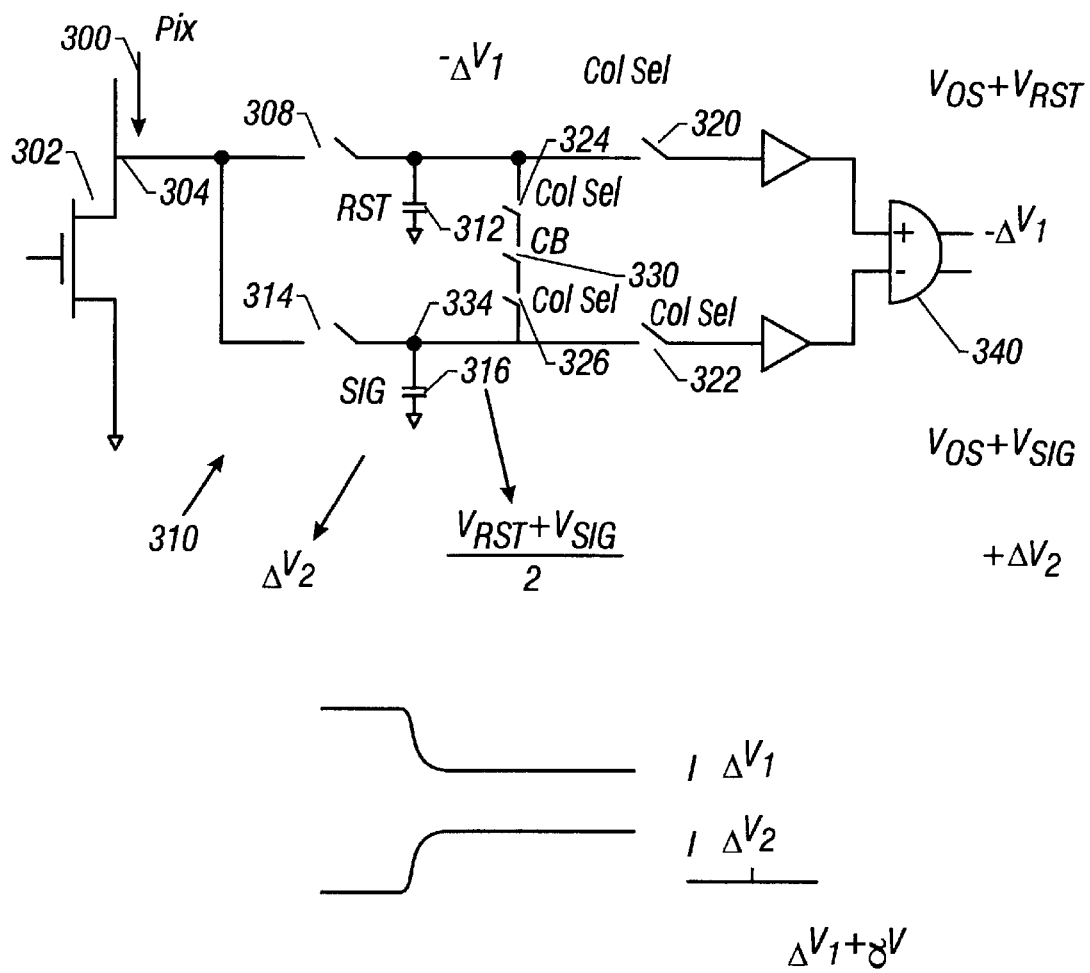
FIG. 3 shows details of the noise reduction circuit which is used.
Figure 3:
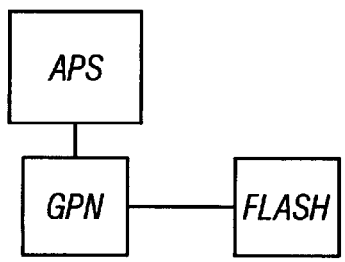

The analog processing circuit of FIG. 3 operates as follows. The signal 300 from the pixel is buffered by a first transistor 302 to form a buffered signal 304. The buffered signal 304 is applied to two parallel circuit parts: a reset leg 306 and a signal leg 310.

The reset leg 306 samples the reset level of the active pixel. The switch 308 is closed to sample the reset level onto capacitor 312. Then, the switch 308 is opened, leaving the reset level charged on the capacitor.

At some subsequent time, the signal switch 314 is closed thereby sampling the signal level onto the sample capacitor 316. The switch is then opened to leave the signal level charged on the capacitor 316.

A column is selected by closing the column select switches, shown as 320, 322, 324, and 326, in unison. This selects the column for use and applies the reset and signal values to the differential amp. At sometime thereafter, the crowbar switch 330 is closed. This has the effect of shorting together the nodes 332 and 334 respectively of the capacitors 312, 316. The voltage on capacitor 312 is $V_{os}+V_{rst}-\Delta V$, and on capacitor 316 is $V_{os}+V_{site}+\Delta V_2$. Hence, the result output voltage becomes the average of the reset voltage (R) and the signal voltage (S) divided by two (R+S)/2. In this way, all offsets are canceled out leaving only a voltage related to the signal minus reset.

The output of the analog processor is then multiplexed to a flash Type A to D converter 204. The flash converter is preferably of the nonlinear type as described herein. The flash converter operates at high speed to analog-to-digital convert the applied signal to form output 206.

The flash converter can be of any desired type. However the preferred flash converter has a non-linear output characteristic.

Figure 4:
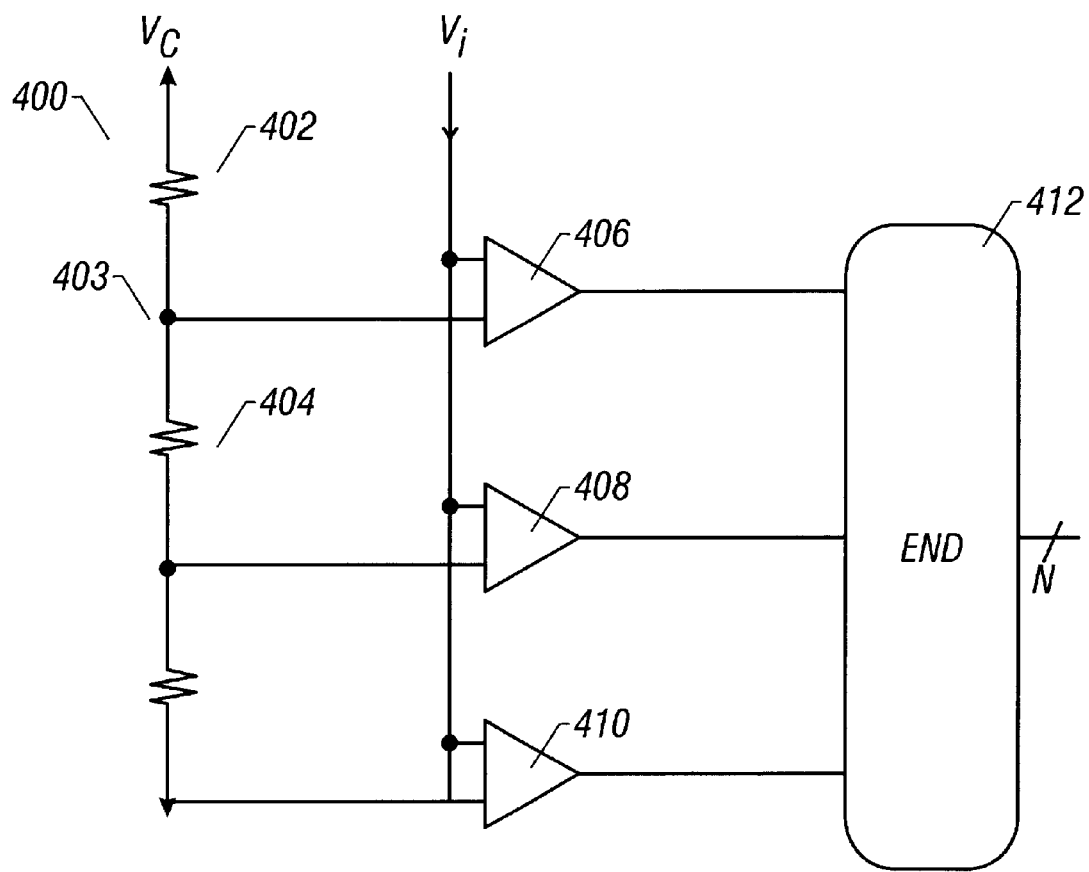
FIG. 4 shows a simplified block diagram of a flash-type A-to-D converter.

A flash converter has the basic structure shown in FIG. 4. A resistor string 400 includes $2^n$ resistors 402, 404, where n is the desired number of bits to resolution. Each two adjacent resistors has a tap 403 therebetween. The voltage on each tap represents a specific voltage in the resistor chain based on Vcc, Vdd, and the resistances above and below the tap. The input voltage $V_2$ to be flash-converted is coupled in parallel to $2^n$ comparators shown as 406, 408, 410. The comparators' output is either "1" or "0" depending on whether the input voltage to be flash-converted is greater than or less than the corresponding voltage applied thereto from the resistor ladder. Hence, the place where the voltage on the comparator outputs change from "0" to "1" represents the location of the incoming analog signal. This position is encoded by encoder 412 to form an N bit digital output where $2^n$ equals the number of resistors 402, 404. This is well known in the art.

The resistor is typically formed from a length of polysilicon or other resistive material with a known resistance. The taps 500 are attached to different locations along the polysilicon 502 as shown in FIG. 5. This resistor is typically uniform, in the sense the resistance between any two adjacent taps is the same as the resistance between any other two adjacent taps, limited only by the resolution of the fabrication. FIG. 6 shows the resistor used in a preferred embodiment. According to this preferred embodiment, a nonuniform resistor is used in the flash A to D converter. The resistor is nonuniform in the sense that the resistance drop across some taps is different than the voltage drop across others of the taps. This nonuniform resistor forms reference voltages which are pre-weighted for both gamma correction and knee correction. The weighting is done according to known correction values.

Figure 9:
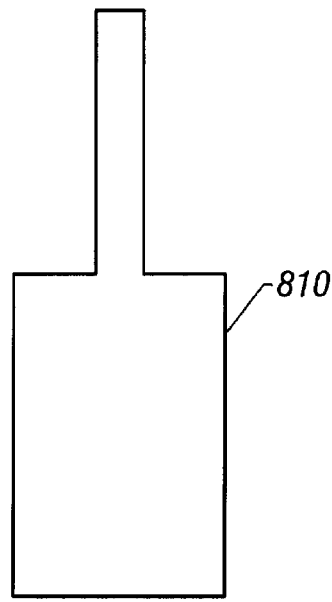
FIG. 9 shows a resultant resistor used according to this teaching.

The non-uniform resistor shown in FIG. 6 has a number of taps which are used to feed reference voltages to the comparators of the flash converter. The resistor shown in FIG. 6 is substantially wedge shaped, and hence the resistance between each two taps is different. Alternative embodiments include a discontinuous resistor such as shown in FIG. 9, explained herein. Another possibility is a resistor having the shape like that in FIG. 5, but varying spacing between the taps, to thereby vary the resistance between two adjacent taps. This nonuniform resistance allows the converter to carry out not only A to D conversion, but at the same time any predetermined weighting characteristic which can be coded into a resistive network, preferably gamma and knee correction.

While this embodiment describes the correction being used for gamma and knee correction, it should be understood that other corrections are also possible.

A second embodiment recognizes that it is difficult to implement a true gamma function in an analog circuit. The continuous gamma function is approximated by a piece wise linear curve. Hence, this second embodiment forms the gamma function using a piece-wise linear curve with a flash A to D converter that has a nonuniform resistor.

For example, let the resistance between tap point I and I—be such that $Ri=5\times10^{-4}i^2+0.5$.

Figure 7A:
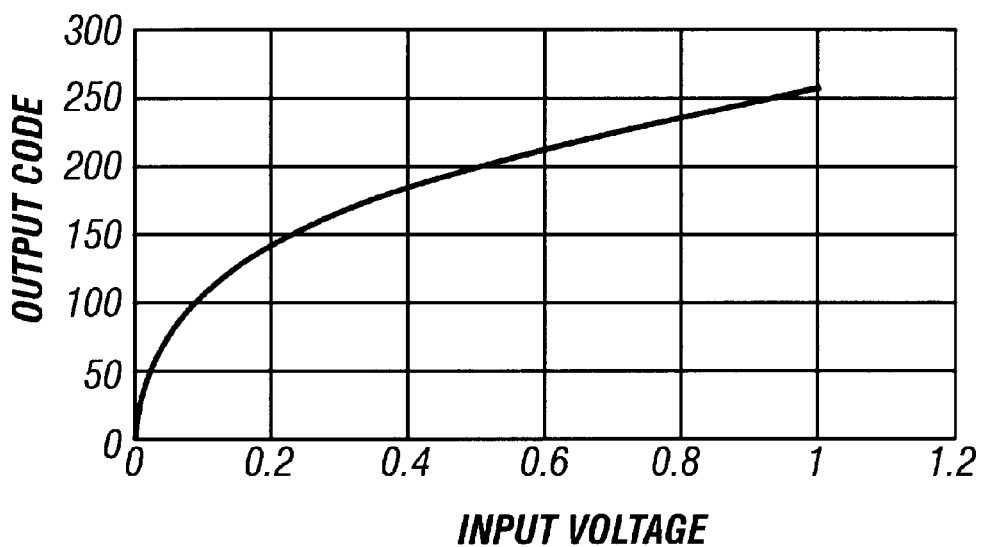
FIGS. 7A and 7B show respective input voltages for different kinds of resistors.
Figure 7B:
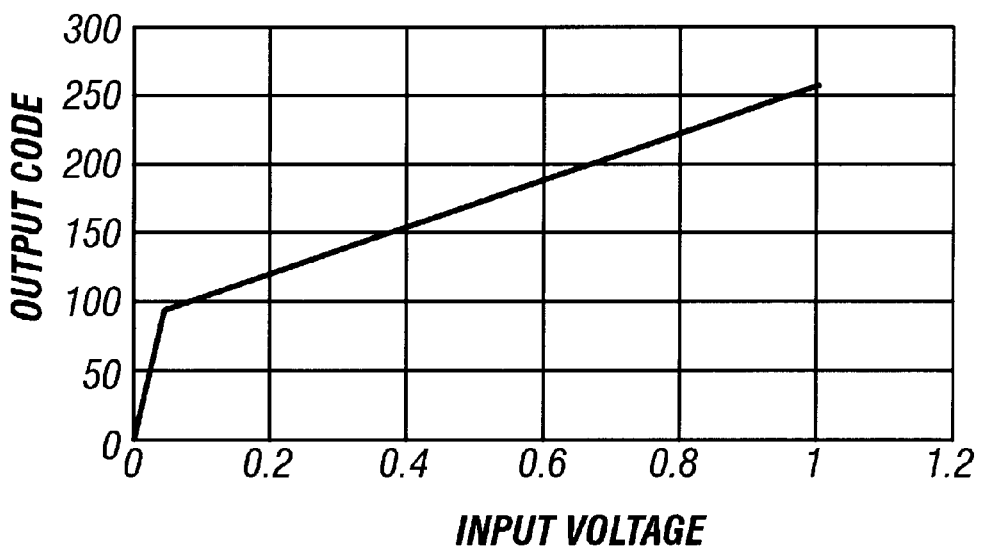

For 1V reference voltage across the resistor string, a total current of about 0.3 milliamps flows, making the total resistance about 3 K5L. The resultant non-linear characteristic of the full flash A to D converter becomes as shown in FIG. 7A.

Figure 8:
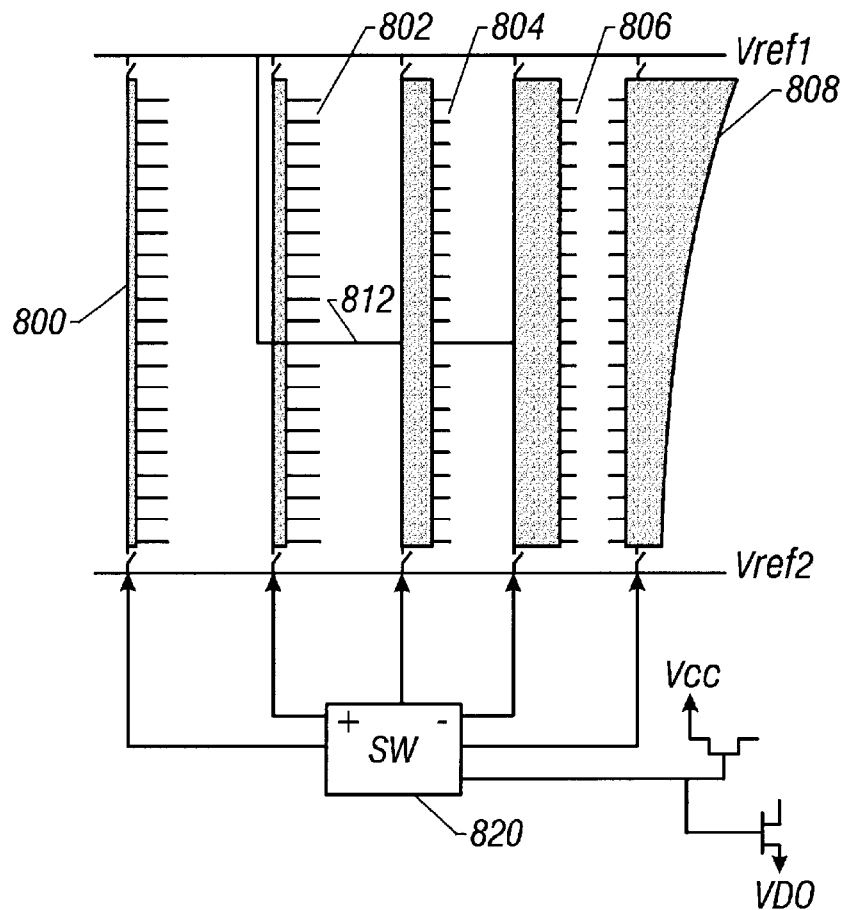
FIG. 8 shows another embodiment of the resistor system used in the flash converter of the present invention.

Implementation of a piecewise linear transfer function can be carried out by dividing the resistor string into two portions. An embodiment of this system is shown in FIG. 8. FIG. 8 shows five different resistor parts labeled as 800, 802, 804, 806, and 808. A switching network 820 is connected to each of the resistor parts, and is used to switch between any tap on any one resistor and any tap on any other resistor. The switching network can include a plurality of switchable transistors, each transistor connected to one of the taps, and a number of switching transistors connected to each of the switched transistors. The way in which a switching embodiment of this type would be implemented is well known in the art. The advantage is that this switching element enables any tap to be connected to any other tap.

As shown, each of the spaces between tap on 800 have a resistance of R1, and each of the taps on 802 have a different resistance R2. Similarly, the taps on 804 and 806 have different resistances. A variable tap resistor 808 could also be used as shown.

The connection line 812 schematically shows the way in which the resistors are connected to form the gamma correction. The first n taps are from resistor 802, and the next m taps are from resistor 806. This produces an equivalent resistor to that shown in FIG. 9. These different resistors and resistor parts hence could be used and connected together to form any desired biasing element to the flash converter part, and hence any desired kind of compensation or correction. The switching network 820 also includes, as shown, connections to the positive voltage Vcc and to the negative voltage Vdd. Hence, each resistor string can be connected or disconnected to any reference value at any location.

The total resistance, therefore, can become any desired resistance at any desired form.

The total resistance, therefore, becomes nR1+mR2; the total number of taps being n+m.

Several resistor chains are formed. Each has a characteristic value of ohms per tap which is constant or non constant. Each resistor string is either disconnected from or connected to either voltage reference value. Each tap may also be optionally connected across a tap point to another resistor.

The system shown in FIG. 85 hence includes a number of different switching elements. A connection may therefore pass through one or more different strings as desired. This enables forming different transfer functions depending on any desired characteristic. The transfer function can also be dynamically changed. For example, I the gamma/knee function described above, the knee point could be dynamically adjusted by switches 500-510.

In the first characteristic, each resistor string has a constant number of ohms per tap. This allows a piecewise linear characteristic to be generated. The knee point and gamma point may be programmably adjusted.

Any non constant ohms per tap will give a portion of the string that is non-linear.

This approach allows the characteristic of the A to D converter to be adjusted on the fly, and hence allows gamma correction to be adjustable easily during sensor operation as the scene changes.

Although only a few embodiments have been described in detail above, other embodiments are contemplated by the inventor and are intended to be encompassed within the following claims. In addition, other modifications are contemplated and are also intended to be covered.

What is claimed is:

1. A nonlinear flash analog-to-digital converter system, comprising:

a nonuniform resistor formed of a resistive material, with a plurality of taps connected to said resistive material to connect to different parts of said resistive material, resistances between said taps being different than each other in a specified way to form voltage differences between two adjacent reference voltages, at least one of said voltage differences being different than another of said voltage differences; and a flash A to D converter part, responsive to said reference voltages, to compare an input voltage with said reference voltages and output a digital signal indicative of a comparison therebetween.

2. A system as in claim 1 wherein said nonuniform resistor is formed by machining a resistor material into a nonuniform shape.

3. A system as in claim 2 wherein said nonuniform shape is substantially wedge-shaped so that each voltage drop between each two adjacent taps is substantially different.

4. A system as in claim 2 wherein said nonuniform shape includes a small portion and a large portion, so that resistance between taps at said small portion are different than resistance between taps at said large portion.

5. A system as in claim 1 wherein said nonuniform resistor is formed by a first resistor part, a second resistor part which is separate from said first resistor part, and a switched connection between said first and second resistor parts.

6. A system as in claim 5 further comprising a switching network, allowing switching between said first and second resistor parts.

7. A system as in claim 1 wherein said nonuniform resistor includes embedded therein a weighting for improving some aspect of an output of an image sensor.

8. A system as in claim 7 wherein said weighting includes a gamma correction and a knee correction.

9. An image sensor, comprising:

an image sensor portion, producing analog output signals indicating sensed information; and a flash type analog-to-digital converter, including a resistive ladder, said analog-to-digital converter receiving said analog output signals indicating said sensed information, and converting said analog output signals into a digital signal, said analog-to-digital converter converting said signal to digital by comparing said signal with a plurality of reference voltages from said resistive ladder for said flash converter, said plurality of reference voltages being nonuniform according to a characteristic that improves some aspect of viewability of said signals, to thereby produce improved viewability digital output signals.

10. A system as in claim 9 wherein said image sensor is an active pixel sensor and said A to D converter is integrated on a same substrate with said image sensor.

11. A system as in claim 10 wherein said A to D converter includes a resistive ladder formed of a resistor that is nonuniform in a specified way.

12. A system as in claim 11 wherein said nonuniform resistor includes at least resistance difference between two adjacent taps that is different than a resistance between two different adjacent taps.

13. A system as in claim 11 wherein said voltage drop across any two adjacent taps is continuously variable.

14. A system as in claim 11 wherein said resistive ladder is formed of a plurality of resistor parts, each said resistor part having a plurality of taps, and a switching network, connected to at least a group of said plurality of taps, allowing said plurality of taps to be selectively connected, such that a portion of one of said resistor parts can be connected in series with a portion of another one of said resistor parts.

* * * * *

UNITED STATES PATENT AND TRADEMARK OFFICE
CERTIFICATE OF CORRECTION

PATENT NO.   : 6,295,013 B1
DATED        : September 25, 2001
INVENTOR(S)  : Eric R. Fossum, Daniel Van Blerkom and Sandor L. Barna It is certified that error appears in the above-identified patent and that said Letters Patent is hereby corrected as shown below:

<u>Title page,</u>
Item [75], Inventors, please change "Daniel Van Blerkam" to -- Daniel Van Blerkom --.

Signed and Sealed this

Twenty-seventh Day of August, 2002

Attest:

Attesting Officer

JAMES E. ROGAN
*Director of the United States Patent and Trademark Office*